United States Patent
Sobhani

[11] Patent Number: 5,317,478
[45] Date of Patent: May 31, 1994

[54] HERMETIC SEALING OF FLEXPRINT ELECTRONIC PACKAGES

[75] Inventor: Mohi Sobhani, Encino, Calif.

[73] Assignee: Hughes Aircraft Company, Los Angeles, Calif.

[21] Appl. No.: 39,715

[22] Filed: Mar. 30, 1993

Related U.S. Application Data

[63] Continuation-in-part of Ser. No. 790,898, Nov. 12, 1991.

[51] Int. Cl.$^5$ .............................................. H05K 7/20
[52] U.S. Cl. ............................ 361/689; 361/688; 361/704; 361/749; 257/710; 257/714; 174/65 R; 165/185
[58] Field of Search ............... 361/679, 687, 688, 689, 361/701, 704, 699, 714, 749; 257/714, 710; 174/524, 65 R; 165/185, 80.4

[56] References Cited

U.S. PATENT DOCUMENTS

| | | | |
|---|---|---|---|
| 4,558,397 | 12/1985 | Olsson | 361/404 |
| 4,597,617 | 7/1986 | Enochs | 339/17 CF |
| 4,695,870 | 9/1987 | Patraw | 357/74 |
| 4,739,443 | 4/1988 | Singhdeo | 361/382 |
| 4,873,615 | 10/1989 | Grabbe | 361/395 |
| 5,041,943 | 8/1991 | Ilardi et al. | 361/386 |
| 5,065,281 | 11/1991 | Hernandez | 361/388 |
| 5,070,936 | 12/1991 | Carroll et al. | 165/80.4 |

Primary Examiner—Leo P. Picard
Assistant Examiner—Young Whang
Attorney, Agent, or Firm—M. E. Lachman; M. W. Sales; W. K. Denson-Low

[57] ABSTRACT

A hermetically sealed electronics package in which an electronic element located on a support is hermetically sealed using a cover comprising the top layer of a multilayer flexprint or a separate flexprint. The top layer of the flexprint or the separate flexprint is supported above the electronic element by a frame structure. When the cover comprises the top flexprint layer, the top layer is only partially bonded to the underlying flexprint during fabrication of the package. After circuit placement, the flap portion of the top flexprint layer is bonded to the flexprint to provide hermetic sealing of the underlying electronic elements. The frame structure provides support for the flexprint cover to prevent deformation of the cover and resulting damage to the underlying circuit. A cooling system is also disclosed for use in combination with the hermetic seal configuration to provide an electronic package which is protected from both contaminants and built-up heat.

24 Claims, 3 Drawing Sheets

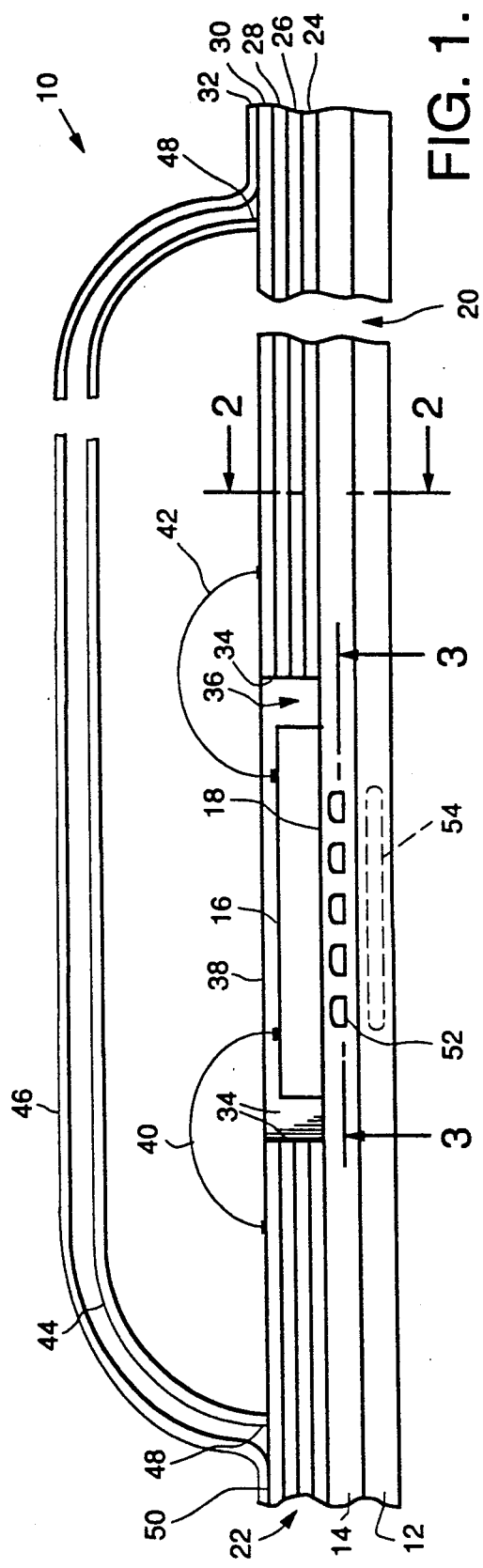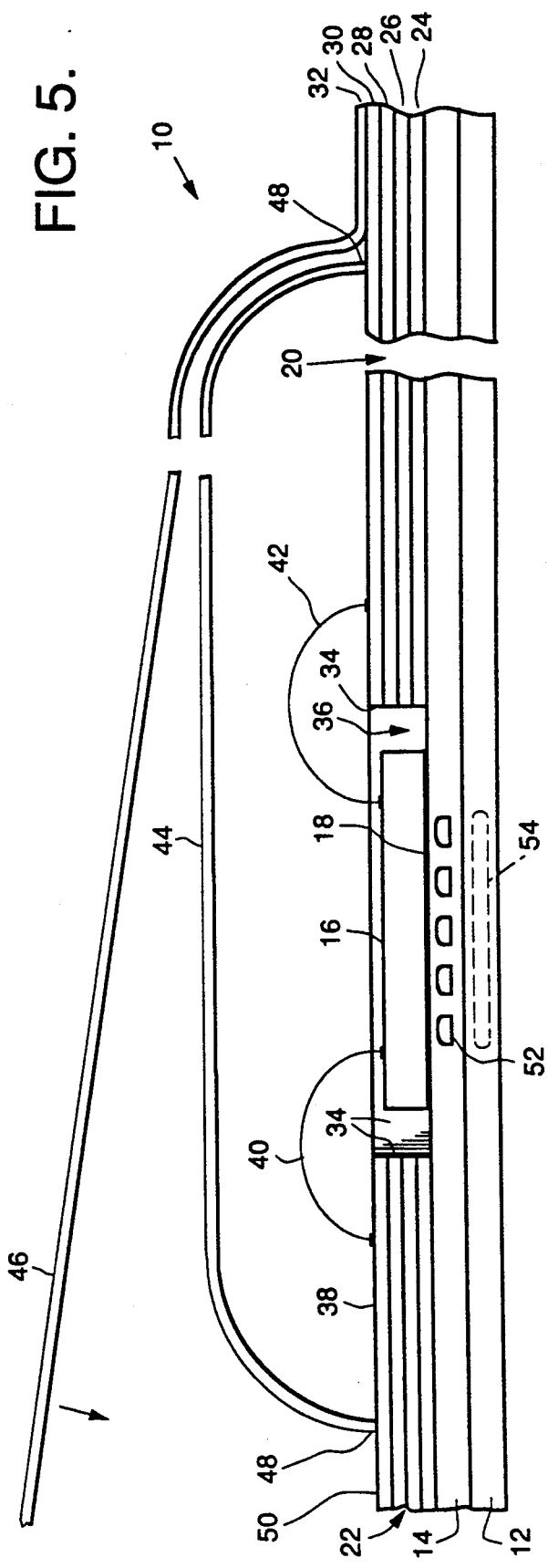

HERMETIC SEALING OF FLEXPRINT ELECTRONIC PACKAGES

This is a continuation-in-part of application Ser. No. 07/790,898 filed Nov. 12, 1991.

BACKGROUND OF THE INVENTION

1. Field of the Invention

The present invention relates generally to hermetically sealing electronic elements associated with electronic circuitry. More particularly, the present invention relates to providing hermetically sealed packages of flexprints and chips, integrated circuits, and other electronic elements.

2. Description of Related Art

Flexprint electronic blanket packages are widely used to house and interconnect electronic elements including integrated circuit chips. The flexprint package generally includes a support wafer or base onto which the flexprint blanket is placed. The flexprint blanket or body is made up of one or more layers of flexprint. Flexprint is the term commonly used to describe flexible layers of plastic which are laminated with alternating layers of a metal and having an outer metal coating. The most common flexprints are made from polyimide laminated with copper.

The plurality of layers of flexprint which form the blanket package are laminated onto the underlying silicon wafer. Usually between 5 and 15 flexprint layers are used to form the blanket body which generally is on the order of 0.050 inch (0.12 cm) thick. Openings or cavities are made in the blanket body for housing various electronic integrated circuits (IC's) and other elements. The silicon wafer forms the bottom of the well with the electronic element typically being attached to the silicon wafer by eutectic bonding. Electrical connections are made between the chip and the various metallic pads present on the flexprint layers.

A typical problem with any electronic package is the prevention of contamination or corrosion of the integrated circuit chips and electrical connections. In order to avoid premature failure of the electronics package, it is important that the package assembly be hermetically sealed to prevent such corrosion and contamination of the integrated circuit. Accordingly, there is a continuing need to provide flexprint blanket and other flexprint assemblies wherein the cavities in which the electronic elements are located are hermetically sealed. Preferably, the hermetic sealing of the cavities is achieved quickly, simply and efficiently, at a minimum of cost. Although adequate hermetic seals may be obtained utilizing a variety of metallically sealed packages, there is still a continuing need to simplify and reduce the cost, weight and volume of electronic assemblies.

The dissipation of heat from electronic package assemblies is also an important consideration. Without adequate cooling systems, the electronic package will quickly overheat and destroy or shorten the life of the temperature sensitive electronic elements contained therein. This problem is especially critical in devices which operate at power levels of 50 watts and beyond. There is a continuing need to provide systems and methods which efficiently cool and transfer the generated heat away from IC's, to prevent overheating.

SUMMARY OF THE INVENTION

In accordance with the present invention, a flexprint electronic package is provided wherein the chips and other electronic elements located within the package are hermetically sealed in a simple and efficient manner.

The present invention is based upon an electronic package which includes an electronic element support, which may comprise a wafer and which has a top surface for receiving and supporting one or more electronic elements. One or more electronic elements are located on the top surface of the wafer or support. These electronic elements are located in cavities within a flexprint or a blanket body which is made up of one or more flexprint layers. As a feature of the present invention, a frame structure is provided which extends over the electronic elements and their leads to the flexprint and which is resistant to deformation forces in order to protect the electronic elements and their leads from damage. The frame structure includes a base which is located on the top surface of the flexprint or the flexprint blanket body. A cover is provided over the frame structure. The cover also includes a base which is located on the top surface of the flexprint or the flexprint blanket body to provide hermetic sealing of the electronic elements and their leads therein. This sealing configuration provides a simple and efficient hermetic seal surrounding the electronic elements and their leads.

As a feature of the present invention, the cover which is placed over the underlying frame structure also forms the top layer of the flexprint or, alternatively, is a separate flexprint. When the cover is a flexprint layer, it initially is only partially attached to the upper layer of the remainder of the flexprint. After installation of the electronic elements into the flexprint/blanket body, the unattached flexprint flap is used to cover the frame structure. The flexprint flap is then bonded to the remainder of the flexprint in order to provide a hermetic seal. When the cover comprises a separate flexprint rather than an upper layer of a flexprint, the separate flexprint is similarly bonded to the underlying flexprint. The use of the flexprint or a layer thereof as the hermetic seal cover provides a simple, inexpensive and efficient hermetic seal.

As another feature of the present invention, the hermetically sealed package is cooled during high power usage by providing a series of conduits through the wafer or by securing separate conduits to the support. The conduits are connected to an external cooling fluid. The cooling fluid is continually passed through the conduits to absorb heat and remove it from the sealed electronics package. In this way, a simple and efficient cooling system is provided. When the cooling system is combined with the hermetic sealing of the electronics package in accordance with the present invention, the result is an electronics package with significant protection against moisture, contaminants and built-up heat to thereby protect and prolong the life of the electronic elements.

The above-discussed and many other features and attendant advantages of the present invention will become better understood by reference to the following detailed description when taken in conjunction with the accompanying drawings.

BRIEF DESCRIPTION OF THE DRAWINGS

FIG. 1 is a partial side sectional view of an electronic and wafer blanket package in accordance with a first embodiment the present invention.

FIG. 5 is a partial sectional side view of the electronics blanket package depicted in FIG. 1 in accordance with the present invention prior to the cover being bonded to the electronic package blanket.

DETAILED DESCRIPTION OF THE INVENTION

Figure 2:
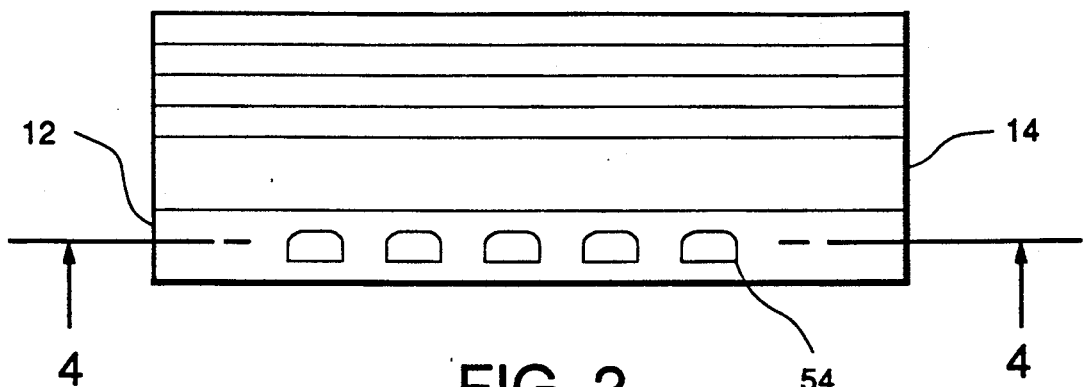
FIG. 2 is a sectional view of FIG. 1 taken in the 2—2 thereof plane.

An exemplary hermetically sealed electronics package in accordance with the present invention is shown generally at 10 in FIG. 1. The electronics package 10 includes silicon wafers 12 and 14. The silicon wafers are typically between 0.030 and 0.050 inch (0.08 to 0.13 cm) thick. Although it is preferred that wafers 12 and 14 are made of silicon, any other suitable electronic wafer support material may be used.

An exemplary electronic element in the form of an integrated circuit is shown at 16. The integrated circuit 16 is attached to the top surface of wafer 14 by eutectic bonding. The eutectic bond is shown at 18. Although eutectic bonding of the integrated circuit 16 to the silicon wafer 14 is preferred, any other conventional bonding technique may be utilized.

Figure 6:
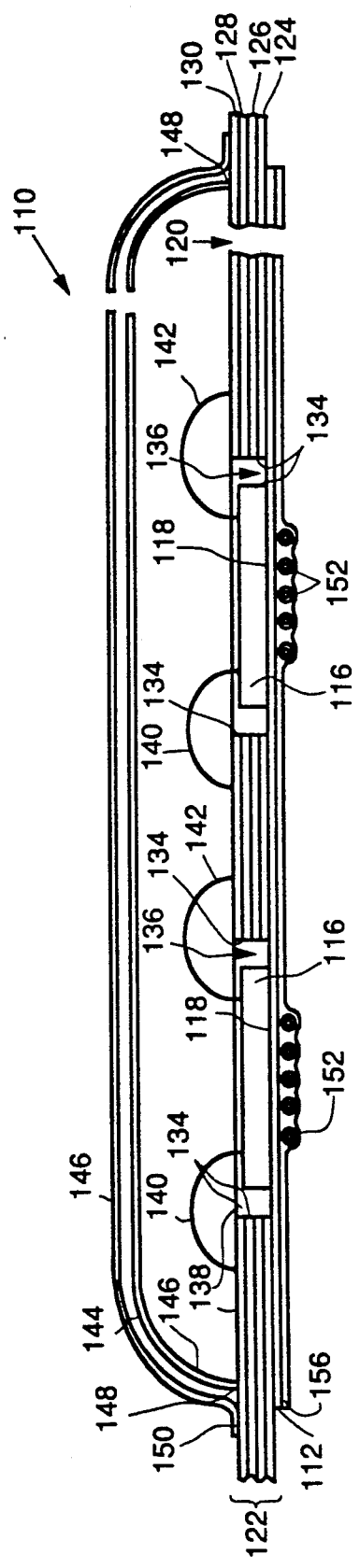
FIG. 6 is a partial side sectional view of an electronic flexprint package in accordance with a second embodiment of the present invention, in which a hermetically sealed package includes a plurality of electronic elements supported on a common support and secured and interconnected to a portion of a flexprint.

In FIG. 1, a single integrated circuit 16 is depicted for demonstration purposes only. As is well known, typical electronic packages include many integrated circuits attached at spaced locations on the silicon wafer, such as illustrated in FIG. 6. As indicated by gap 20 in FIG. 1, only a portion of the electronics package is depicted, with it being understood that many other integrated circuits are typically present on the silicon wafer 14.

A blanket body or a flexprint 22 is located on top of the silicon wafers 12 and 14. The blanket body 22 includes a plurality of flexprint layers. The preferred exemplary blanket body 22 shown in FIG. 1 includes 5 flexprint layers 24, 26, 28, 30 and 32. The flexprint layers 24–32 are conventional flexprint layers made from polyimide laminated with a suitable metal. Such flexprint films are commonly referred to as H film. These films are widely available from Dupont Corporation which markets these films under the trademark Kapton ®. The flexprint films 24–32 are preferably between 0.002 to 0.003 inch (0.002 to 0.008 cm) thick. As is well known, the flexprint layers include a metal coating. The metal coating is relatively thin compared to the overall thickness of the flexprint layer. Copper is the preferred metal coating for the flexprint layer. Other suitable metal coatings include aluminum, nickel and gold.

As shown in FIG. 1, the blanket body 22 has an encircling interior perimeter surface 34 which defines a cavity 36 in which the electronic element 16 is housed. The cavity 36 is fabricated in the blanket body 22 by etching or other conventional electronic board fabrication technique. The top surface 38 of the blanket body 22 is preferably located above the height of integrated circuit 16. The relative heights of the integrated circuit 16 and blanket body 22 will depend for the most part upon the number of flexprint layers utilized for the circuit board. The number of flexprint layers will vary between 1 to more than 10 depending upon the complexity of the circuitry. The integrated circuit 16 is connected to the conductive metal coating present on the flexprint layers by way of connectors 40 and 42. This connection is made by solder or any other electrically conductive connection. The integrated circuit 16 is shown being connected to only the upper flexprint board 30 for demonstration purposes only. It will be understood by those skilled in the art that the integrated circuit 16 will be connected via numerous interconnections between various different flexprint layers. The flexprint layers 24–32 are laminated together in accordance with conventional lamination procedures.

In accordance with the present invention, the integrated circuit 16 is hermetically sealed by providing a plastic frame structure 44 and a cover 46 over the cavity 36. The plastic frame structure 44 may be made from any plastic material which is inert, structurally strong, does not outgas, and has electrostatic isolation. By structurally strong, it is meant that the structure 44 is able to resist deformation forces to prevent collapse onto and damage to the chip and its leads. Suitable plastic materials include polyimides, epoxy resins or other polymers. Other frame structure materials, such as ceramics and other non-conductive materials may be utilized provided that they are structurally strong, non-reactive in an electronic package environment and non-conductive to provide protection from electromagnetic interference.

The size and shape of the frame 44 is such that a dome is provided over the integrated circuits to be sealed. The frame structure 44 terminates in a base 48 which is attached securely to the top surface 38 of the blanket body 22. Attachment or bonding of the frame structure 44 to top surface 38 is preferably accomplished by using a suitable adhesive, such as an epoxy material. The frame structure 44 may be a solid piece of material or it may be perforated to reduce weight. The important criteria for the frame structure 44 is that it be suitably strong to prevent the more flexible cover 46 from being compressed downward onto the interconnections 40 and 42 resulting in damage to the circuits and the wire bonds on the electronic elements.

The cover 46 is preferably formed from the upper flexprint layer 32. FIG. 5 shows the preferred exemplary electronics package 10 as the flap portion 46 of the top flexprint layer 32 is lowered into position to form the cover 46 on top of frame structure 44. In the preferred embodiment, the top flexprint layer 32 is initially only partially bonded to the other laminated flexprint layers 24–30. The top flexprint layer 32 is not bonded to the rest of the blanket body at those locations where support frame structure 44 is to be placed. After the support frame is in place, the unbonded flap portion 46 of upper flexprint layer 32 is placed over frame 44 and then bonded to the flex body at 50 (as shown in FIGS. 1 and 5) in order to provide a hermetic seal. Bonding of the flap 46 to the blanket body 22 can be accomplished using any of the known laminating adhesives procedure for printed wiring flexprints such as using an epoxy resin prepreg under increased temperature and pressure. Alternatively, a dry film prepreg may be used.

Although other possible cover materials can be utilized to provide an appropriate cover 46, it is preferred that the cover material be an unbonded flap portion of the top flexprint layer. By using the top flexprint layer as a cover, a quick, effective, and inexpensive cover is provided which is capable of maintaining a hermetic seal over extended periods of time.

However, the cover 46 may also comprise a flexprint which is independent from the flexprint 22, but hermetically sealed thereto, In this configuration, additional electrical connections to other hermetically sealed electronic elements similar to the chip 16, may be obtained.

Figure 3:
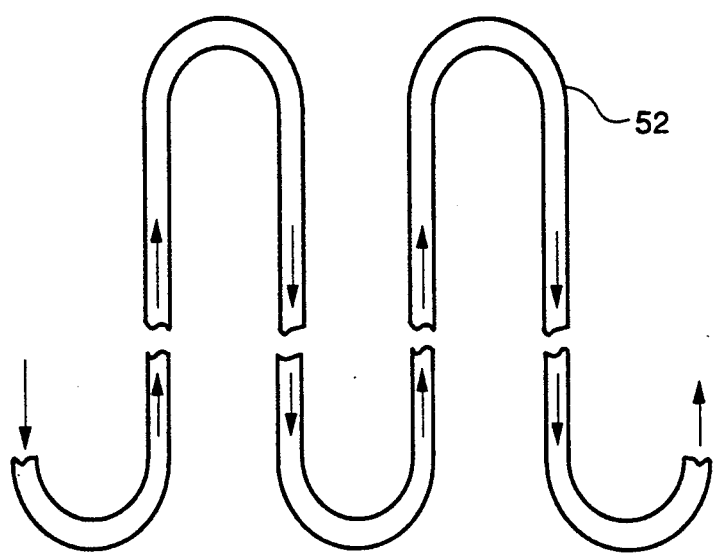
FIG. 3 is a sectional view of FIG. 1 taken in the 3—3 thereof plane.
Figure 4:
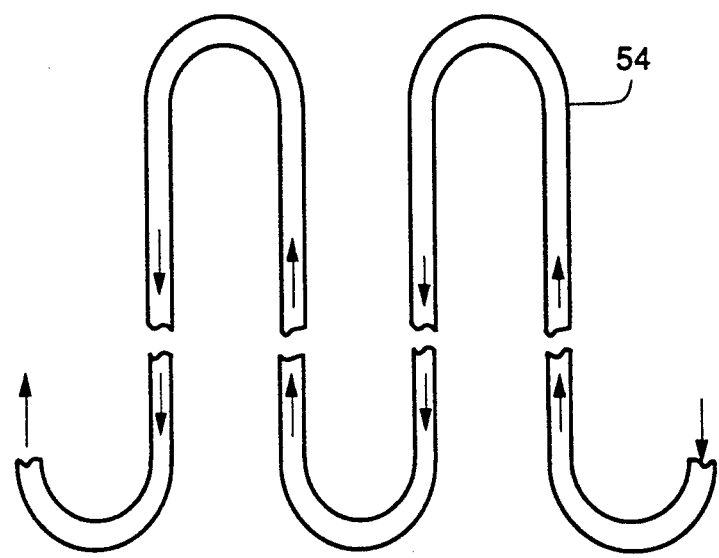
FIG. 4 is a sectional view of FIG. 2 taken in the 4—4 thereof plane.

It is preferred that some means be provided for removing heat generated by the integrated circuits during operation of the electronics package. Preferred exemplary means for cooling the integrated circuit 16 includes conduits 52 and 54 located in wafers 14 and 12 respectively. The conduits are preferably configured as shown in FIGS. 3 and 4. The conduits 52 and 54 are preferably etched into the silicon wafers 12 and 14. The conduits may be formed by other procedures such as imbedding suitable glass or ceramic conduits into the silicon or forming the conduits by micromachining. The conduits 52 and 54 are connected to an external cooling system (not shown). The cooling system cycles cooling fluid to the conduits. Suitable cooling fluids include carbon tetrafluoride, water or other known gases or liquids utilized as heat exchange fluids. The conduits 52 and 54 may be located throughout the wafers 12 and 14 if desired. However, it is preferred to locate the cooling conduits 52 and 54 only directly under each integrated circuit to maximize heat removal while minimizing the cost and complexity of providing conduits throughout the entire body of each of the wafers.

The conduits preferably have a diameter in the range of about .0.005 to 0.015 inch (0.013 to 0.038 cm). Although the internal diameter of the conduits and the size of the conduit patterns may be the same for each wafer 12 and 14, it is preferred that conduit 52 located in wafer 14 be smaller than the conduit 54 located in wafer 12. For example, if conduit 52 has an internal diameter of 0.010 inch (0.025 cm) and a lateral spacing between conduit turns of 0.040 inch (0.14 cm), then the preferred size of conduit 54 would be an internal diameter of 0.02 inch (0.05 cm) and a lateral spacing between conduits of about 0.08 inch (0.20 cm). Further, the relative positioning of the conduits 52 and 54 are preferably perpendicular to each other so that the straight lengths of conduit intercept each other at right angles. This angle relationship is believed to provide maximum cooling capacity for the electronic element.

Referring now to FIG. 6, a hermetically sealed package 110 is formed on a portion of a flexprint or flexible electric cable 122, which extends beyond the package 110 and which can be bent or otherwise configured in accordance with the system in which the hermetically sealed package 110 and the flexprint 122 are parts.

The package 110 is similar to the package 10 depicted in FIGS. 1 and 5. In FIG. 6, the flexprint 122 includes a plurality of cavities 136 cut into flexprint layers 124-130 so that each cavity is bounded by an interior perimeter walled surface 134. A plurality of integrated chips or other electronic elements 116 are housed within the cavities 136, preferably below top surface 138 of the flexprint, and are coupled electrically to the electric leads or traces of the flexprint 122 by connectors 140 and 142.

A deformation resistant frame structure 144, which is constructed like the frame 44 of FIGS. 1 and 5, is positioned over all electronic elements 116 and their electric connections 140 and 142 to protect them from being squashed or otherwise damaged. The frame 144 is positioned on and bonded at its base 148 to the flexprint top surface 138.

A cover 146 is positioned over the frame 144 and is hermetically sealed by bonds 150 also to the flexprint top surface 138. The cover 146 may be formed like the flexprint 146 of FIGS. 1 and 5, e.g., as a separate plastic film, as a separate flexprint, or as a top layer of the flexprint 122. Thus, the cover 146 may terminate at the bonds 150 or extend therebeyond along the flexprint 122, such as is shown in FIGS. 1 and 5.

Unlike the package 10 of FIGS. 1-5, however, the package 110 of FIG. 6 replaces wafers 12 and 14 by a support 112, to which the electronic elements 116 and affixed by eutectic bonds 118. The support 112 has sufficient rigidity to support the electronic elements 116 and to protect them from bending forces and possible fracture or other breakage. A plurality of coolant passages or conduits 152 are thermally and mechanically secured to the support 112 for removal of heat therefrom to a heat sink. The mechanical securement of the conduits 152 to the support 112 may be provided by a laminate 156 of plastic or other material by conventional bonding techniques.

Having thus described exemplary embodiments of the present invention, it should be noted by those skilled in the art that the within disclosures are exemplary only and that various other alternatives, adaptations, and modifications may be made within the scope of the present invention. Accordingly, the present invention is not limited to the specific embodiments as illustrated herein, but is only limited by the following claims.

What is claimed is:

1. A hermetically sealed electronics package comprising:
   a flexprint comprising at least one layer and having cavity means defining at least one cavity;
   an electronic element support secured to said flexprint and underlying at least said cavity means;
   electronic element means defining at least one electronic element having electrical connections to said flexprint, said electronic element means located in said cavity means and on and supported by said electronic element support;
   a deformation resistant frame structure extending above said electrical connections, said cavity means and said electronic element means therein, said frame structure having a base which is located on said flexprint; and
   a cover located on said frame structure and also extending above said electrical connections, said cavity means and said electronic element means therein, said cover also having a base which is hermetically sealed to said flexprint to provide hermetic sealing of said cavity means and said electronic element means therein.

2. The hermetically sealed electronics package according to claim 1 wherein said electronic element support comprises a wafer and said flexprint comprises a blanket body having a plurality of flexible layers blanketing said wafer.

3. The hermetically sealed electronics package according to claim 2 wherein said wafer further comprises means for cooling said electronic element.

4. The hermetically sealed electronics package according to claim 3 wherein said cooling means comprises cooling conduits located within said wafer and the cooling means for introducing and removing cooling fluid from said conduits to provide cooling of said electronic elements.

5. The hermetically sealed electronics package according to claim 2 wherein said cover comprises the upper most layer of said flexible layers.

6. The hermetically sealed electronics package according to claim 2 wherein said cover comprises a separate flexprint.

7. The hermetically sealed electronics package according to claim 1 wherein said frame structure is plastic.

8. The hermetically sealed electronics package according to claim 7 wherein said frame structure plastic is selected from the group consisting of polyimide and epoxy.

9. The hermetically sealed electronics package according to claim 1 wherein said cover is a flexible plastic laminated with metal.

10. The hermetically sealed electronics package according to claim 9 wherein said metal laminated plastic includes a metal coating selected from the group consisting of copper, aluminum, nickel and gold, and said plastic is a polyimide.

11. The hermetically sealed electronics package according to claim 10 wherein said metal laminated plastic cover and said layer of said blanket body are made from the same plastic and have the same metal coating.

12. The hermetically sealed electronics package according to claim 11 wherein said blanket body comprises a plurality of layers and wherein the top layer of said blanket body is also said metal laminated plastic cover.

13. The hermetically sealed electronics package according to claim 1 in which said cavity means comprise a plurality of cavities and said electronic element means comprise a plurality of electronic elements positioned in said cavities, wherein said frame structure and said cover extend over a plurality of said cavities in which said electronic elements are located to provide hermetic sealing thereof.

14. The hermetically sealed electronics package according to claim 1 in which said electronic element support underlies only portions of flexprint adjacent to said electrical connections, said cavity means and said electronic element means therein, to permit flexure of remaining portions of said flexprint.

15. The hermetically sealed electronics package according to claim 14 further comprising means for cooling said electronic element means.

16. The hermetically sealed electronics package according to claim 14 wherein said cooling means comprises cooling conduits secured to said support and means for introducing and removing cooling fluid from said conduits to provide cooling of said electronic elements.

17. A method for providing a hermetically sealed electronics package comprising the steps of:
locating electronic element means defining at least one electronic element and cavity means defining at least one cavity in a flexprint;
an electronic element support secured to said flexprint and underlying at least said electronic element cavity means;
positioning a deformation resistant frame structure above the cavity means and the electronic element means therein, and on the flexprint;
positioning a cover over the frame structure and the electronic element means; and
hermetically sealing the cover to the flexprint to provide a hermetically sealed electronic element means and flexprint package.

18. The method for hermetically sealing an electronics package according to claim 17 further including the step of cooling the electronic element by locating cooling conduits in the electronic element support.

19. The method according to claim 17 further comprising the steps of configuring the electronic element support as a wafer and the flex-print as a plurality of flexible layers blanketing the wafer.

20. The method according to claim 19 further comprising the step of configuring the cover as the upper most layer of the flexible layers.

21. The method according to claim 17 further comprising the step of configuring the cover as a separate flexprint.

22. The method according to claim 17 further including the step of applying cooling means to the support for cooling the electronic element means.

23. The method according to claim 22 in which said cooling means applying step comprises the step of securing cooling conduits to the support on the side thereof opposite from that to which the electronic element means is secured by a laminate.

24. A hermetically sealed electronics package comprising:
a flexprint comprising a plurality of layers and having cavity means therein defining at least one cavity;
an electronic element support secured to said flexprint and underlying said cavity means;
cooling means cooling an electronic element and the cooling means secured below said electronic element support;
electronic element means defining at least one electronic element having electrical connections to said flexprint, said electronic element means being located in said cavity means and on and supported by said electronic element support;
a rigid frame structure extending above said electrical connections, said cavity means and said electronic element means therein, said frame structure having a base which is located on said flexprint; and
a cover located on said frame structure and also extending above said electrical connections, said cavity means and said electronic element means therein, said cover also having a base which is hermetically sealed to said flexprint to provide hermetic sealing of said cavity means and said electronic element means therein.

* * * * *